United States Patent [19]

Wallrafen

[11] Patent Number: 5,412,255
[45] Date of Patent: May 2, 1995

[54] SWITCH DEVICE SUITABLE FOR USE IN AUTOMOTIVE VEHICLES

[75] Inventor: Werner Wallrafen, Sulzbach, Germany

[73] Assignee: VDO Adolf Schindling AG, Frankfurt am Main, Germany

[21] Appl. No.: 148,033

[22] Filed: Nov. 4, 1993

Related U.S. Application Data

[63] Continuation of Ser. No. 861,934, Apr. 2, 1992, abandoned.

[30] Foreign Application Priority Data

Jul. 7, 1991 [DE] Germany ............... 41 14 835.5

[51] Int. Cl.⁶ ............... H03K 17/56; G01D 1/18
[52] U.S. Cl. ............................ 307/116; 307/9.1; 340/438
[58] Field of Search ............... 307/9.1, 10.1, 116–118, 307/308, 310, 239, 240, 125, 119–124, 126–131, 139, 143, 144; 361/170; 340/438, 442, 449, 450, 450.1, 450.2, 450.3, 451, 452, 453, 455

[56] References Cited

U.S. PATENT DOCUMENTS

| | | | |
|---|---|---|---|
| 4,554,462 | 11/1985 | Komiya et al. | 307/140 |
| 4,739,309 | 4/1988 | Bräuninger et al. | 340/534 |
| 4,914,419 | 4/1990 | Bragenzer et al. | 340/459 |
| 4,939,382 | 7/1990 | Gruodis | 307/116 |
| 5,016,631 | 5/1991 | Hogrefe | 128/419 PS |
| 5,045,840 | 9/1991 | Berrier et al. | 340/458 X |
| 5,081,411 | 1/1992 | Walker | 323/326 |

FOREIGN PATENT DOCUMENTS 0078511 5/1983 European Pat. Off. .
3146709 2/1983 Germany .
3828428 11/1989 Germany .

OTHER PUBLICATIONS

Rony, Peter R; "Logic & Memory Experiments Using TTL Integrated Circuits-Book One"; Howard W. Sams & Co., Inc.; 1978; pp. 119–121 and 162.

Primary Examiner—A. D. Pellinen
Assistant Examiner—Fritz M. Fleming
Attorney, Agent, or Firm—Martin A. Farber

[57] ABSTRACT

In a switch device, suitable for use as active sensor in an automotive vehicle, wherein current through a load can be switched as a function of a physical variable acting on the switch device, two terminals of the switch device can be connected together via a semiconductor switch. They also form the input of a current supply circuit. A sensor produces an electric signal which represents the physical variable and which can be fed to a threshold circuit. The semiconductor switch is controllable in pulsating manner as a function of the output signal of the threshold circuit.

17 Claims, 1 Drawing Sheet

SWITCH DEVICE SUITABLE FOR USE IN AUTOMOTIVE VEHICLES

RELATED APPLICATION

This application is a continuation of my application Ser. No. 07/861,934, filed: Apr. 2, 1992, now abandoned.

FIELD AND BACKGROUND OF THE INVENTION

The present invention relates to a switch device, particularly for use in automotive vehicles, in which the current through a load can be switched as a function of a physical variable acting on the switch device.

Switch devices in which a load is switched on or off as a function of a physical variable acting on a switch device are frequently used in automotive vehicles. The switch devices can be developed for instance as pressure, temperature, level or distance switches, and generally serve for the switching of warning lights, buzzers or relays. Due to advances in the field of semiconductors, the traditional switching devices of mechanical construction are being replaced to an increasing extent by electronic sensors which give off a switch signal when the physical variable exceeds or drops below a predetermined threshold value. By the use of electronic components there are obtained, inter alia, advantages in manufacture, a reduction in size, a shortening of the response time, and in many cases even a lower price.

One essential disadvantage of such known electronic 2-point sensors is, however, that three connections are necessary, namely one for ground, one for the operating voltage, and one as switch output. In this way there is an additional expense for connectors and lines as compared with the traditional mechanical 2-point sensors.

SUMMARY OF THE INVENTION

It is an object of the present invention to develop a switch device in such a manner that, on the one hand, electronic components and switches can be used and that, on the other hand, the simple connection technique known from traditional mechanical switch devices is possible.

According to the invention, two terminals (1, 2) of the switch device can be connected to each other via a semiconductor switch (3) and furthermore form the input of a stored-charge current-supply circuit (4, 5, 6); a sensor (10) produces an electric signal, which represents the physical variable, and is fed to a threshold circuit (11); and the semiconductor switch can be controlled in pulsating manner as a function of an output signal of the threshold circuit (11).

The switch device of the invention can be used together with warning lights, buzzers or relays in as simple a manner as the traditional mechanical switching devices. When a ground connection is present in the form of the housing and the metal parts of the vehicle, only a single line to the load is necessary.

In the switch device of the invention, the current supply circuit is preferably formed of a rectifier diode (4) and a capacitor (5) and of a voltage stabilizing circuit (6) which is connected thereto. In this way, a continuous supply of current to individual circuits present in the switch device is assured.

A further feature of the invention is that the semiconductor switch (3) is continuously non-conductive in a first switch state and pulsatingly conductive with a large pulse-duty factor, at least approximately 0.9, in a second switch state. The pulse-duty factor is preferably greater than 0.90. Due to the high pulse-duty factor, assurance is had that the load experiences only a slight decrease in power as compared with continuous current. The non-conductive phase of the semiconductor switch in the second switch state is, to be sure, still sufficiently large to supply current to the circuits within the switch device.

By the pulsating control of the load another advantage, as compared with the traditional switch devices, is obtained in the manner that, in the event of a disturbance, for instance if a warning light is continuously lit, one can distinguish between a line short circuit and some other defect by means of a suitable diagnostic instrument on basis of the pulsation.

One advantageous development of this feature provides that the output voltages of the threshold circuit (11) and of a pulse generator (13) can be fed via an AND circuit (14) to the control electrode of the semiconductor switch (3).

Another feature of the invention provides that the semiconductor switch (3) is pulsatingly non-conductive with a large pulse-duty factor in a first switch state, and is pulsatingly non-conductive with a small pulse-duty factor in a second switch state. In this case the pulse-duty factor in the first switch state is also preferably greater than 0.90 and the pulse-duty factor in the second switch state preferably less than 0.1.

This periodic brief connection of the corresponding load in the first switch state can be used, in connection with error diagnosis, to distinguish a break in the line from the "off" switch state.

One advantageous embodiment of this feature consists in the output voltages of the threshold circuit (11) and of a pulse generator (15) being fed via an exclusive-OR circuit to the control electrode of the semiconductor switch (3).

In order to feed the least possible current to the load in its disconnected state, the smallest possible consumption of current by the existing circuits is desirable with the switch device of the invention. Therefore it is preferred that the semiconductor switch be a field-effect transistor (3).

It is frequently useful to characterize a transition region to the actual limit value by suitable control of an acoustic or optical warning device. In accordance with another feature, this is possible in the switch device of the invention in the manner that the periodic control takes place with a frequency which lies above the inertia or time constant or maximum blinking rate of the load (8) and that another periodic control of lower frequency is superimposed on the periodic control in a transition region before the limit value of the physical variable. In this case, with increasing approach of the physical variable to the limit value, the pulse-duty factor in connection with the control with the lower frequency becomes larger and larger, so that the load gradually passes into continuous operation—and therefore a warning lamp changes from blinking to continuous light.

By the use of different electronic circuits in the switch device of the invention, many extensions and developments of the switch device of the invention are possible. Thus, for instance, it can be provided that after the application of voltage to the terminals (1, 2) switching of the semiconductor switch (3) is temporarily effected into the conductive state regardless of the physical variable to be measured, so that control of the connected load (8) and particularly wherein the load consists of lights, is possible.

According to another feature of the invention, the pulsating control of the semiconductor switch is used for error diagnosis.

BRIEF DESCRIPTION OF THE DRAWINGS

With the above and other objects and advantages in view, the present invention will become more clearly understood in connection with the detailed description of preferred embodiments, when considered with the accompanying drawing, of which.

DETAILED DESCRIPTION OF THE PREFERRED EMBODIMENTS

Figure 2:
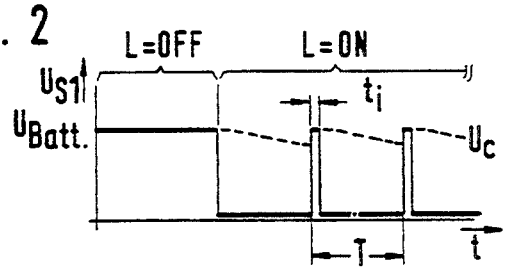
FIG. 2 is a time graph of the voltage at the terminals of the first embodiment.

Identical parts are provided with the same reference numerals in the figures.

In both embodiments, a field-effect transistor 3 is present between the terminals 1, 2. Furthermore, the terminal 1 is connected via a rectifier diode 4 to a capacitor 5 which, on the other hand, is connected to the terminal 2. The voltage on the capacitor 5 is fed to a known voltage stabilization circuit 6, the output voltage of which serves to supply the further assemblies of the switch device. The terminals 1, 2 of the switch device of the invention are inserted in a circuit which is shown in dashed line in FIGS. 1 and 3 and consists for instance of a car battery 7 and a telltale lamp 8.

In order to determine a pressure, a gas tank level, a temperature, or other physical variables, a sensor 10 is provided which is supplied with a stabilized voltage and produces an output voltage which is dependent on the corresponding variable. The output voltage of the sensor 10 is compared in a comparator 11 with a reference voltage $U_{ref}$ which is produced in a suitable source 12. A pulse generator 13 produces pulses with a frequency of about 100 Hz and a pulse-duty factor of about 0.95.

Figure 1:
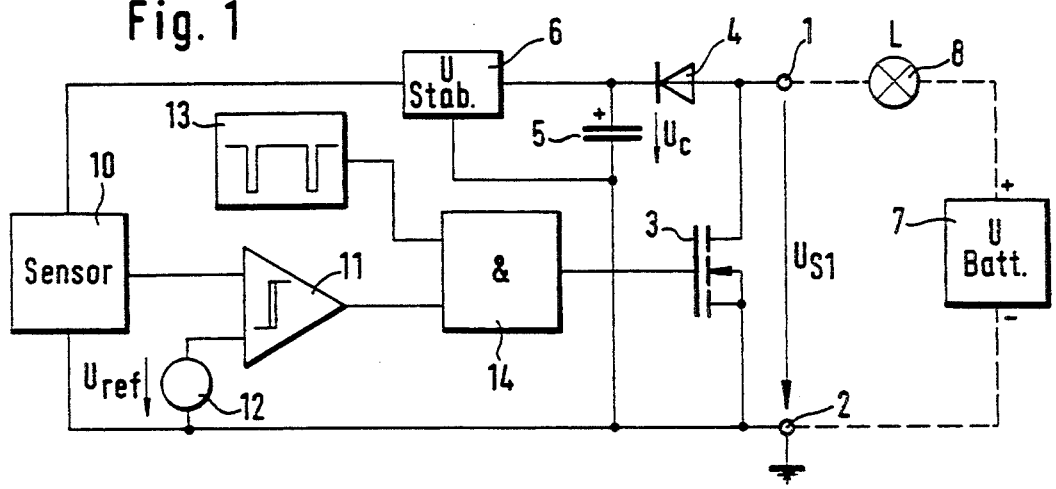
FIG. 1 is a circuit diagram of a first embodiment.

In the embodiment shown in FIG. 1, the pulses produced by the pulse generator 13 and the output signal of the comparator 11 are fed to an AND circuit 14. If the output voltage of the sensor 10 is less than the reference voltage $U_{ref}$, the output voltage of the comparator 11 assumes a low level as a result of which a voltage, which leaves the semiconductor switch 3 in non-conductive state, is given off at the output of the AND circuit 14. The switch device is thus in "off" condition. The lamp 8 does not light up. The current necessary to supply the circuits 10 to 14 is substantially less than the current required to light the lamp 8. The voltage present in this state of switching on the field effect transistor 3 is shown in FIG. 2 as a function of time t during the time designated L=OFF. Also shown in FIG. 2 is a pulse width $t_i$ and pulse period T of the voltage pulses.

If the output voltage of the sensor 10 is greater than the reference voltage $U_{ref}$ then the output signal of the comparator 11 assumes a higher level, which leads to the conducting of the pulses produced by the pulse generator 13, via the AND circuit 14, to the gate (or control) electrode of the field effect transistor 3. The latter is thus periodically brought into the conductive state, as is indicated in FIG. 2 within the time designated by L=ON. The short interruptions in the conductive state serve to permit the capacitor 5 to be charged again via the battery voltage present between the terminals 1 and 2, as a result of which the supplying of the circuits 10 to 14 with current is maintained. In view of the storage of charge in the capacitor 5 via the diode 4, the capacitor circuit may be referred to as a stored-charge current-supply circuit. The interruptions are, however, so brief that no disturbing reduction in brightness is produced upon the lighting of the lamp 8. The voltage $U_c$ on the capacitor 5 drops somewhat, it is true, between two interruptions; with a battery voltage of 12 V and an operating voltage of the circuits 10 to 14 of for instance 5 V, undisturbed operation with adequate voltage and current is attained.

Figure 3:
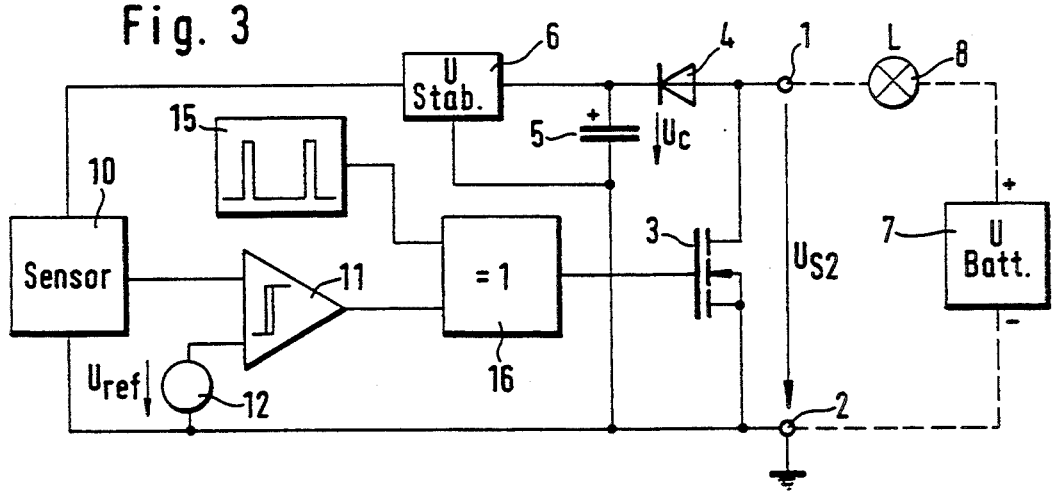
FIG. 3 is a circuit diagram of a second embodiment.

In the embodiment shown in FIG. 3 there is a pulse generator 15 which produces pulses which are inverted with respect to the pulse generator 13 (FIG. 1). These pulses are fed together with the output signal of the comparator 11 to an exclusive OR circuit 16 the output of which is connected to the control electrode of the field-effect transistor 3. As a result of this connection, there is no change in the manner of operation in the case of the "ON" condition.

Figure 4:
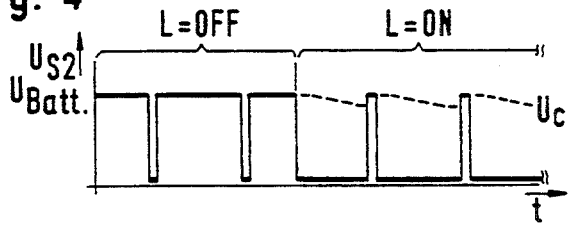
FIG. 4 is a time graph of the voltage at the terminals of the second embodiment.

As shown in FIG. 4, in the "OFF" condition the field-effect transistor 3 is, however, periodically switched into the conductive state. This takes place, however, for such short switching portions that the current through the lamp 8 does not reach the value necessary for it to light up or glow. By the pulses during the "OFF" state it is possible, however, by means of a suitable diagnostic instrument, to determine upon verification whether the switch device is defective as a result of a break in the line or, for instance, in the region of the sensor 10. If there are no pulses, there is probably a break in the line while if there are pulses during the "OFF" state, at least the line to the sensor is without defect.

Instead of the warning lamp 8 shown, other loads such as buzzers or relays for further processing can be connected in the load circuit with the same circuit arrangement (FIGS. 1 and 3).

I claim:

1. A switch device serving to switch current through a load as a function of a physical variable acting on the switch device, the switch device comprising:
   two terminals serving to connect the switch device to said load;
   a semiconductor switch interconnecting the two terminals and having a control electrode;
   a voltage stabilization circuit having an output terminal and being connected between the two terminals to be energizable via the two terminals;
   a sensor which produces an electric signal representing a physical variable, the sensor being connected between the output terminal of the voltage stabilization circuit and one of the two terminals;
   a threshold circuit coupled to an output terminal of said sensor; and
   pulsating means for operating the semiconductor switch in pulsating manner as a function of an output signal of the threshold circuit;
   wherein said pulsating means include a pulse generator and a logic element, said generator producing a train of output pulse signals at a predetermined frequency, output signals of the threshold circuit and of the pulse generator being applied via the logic element to the control electrode of the semiconductor switch;

in a first state of the semiconductor switch, the pulsating means places the semiconductor switch in a mainly nonconductive mode allowing for pulsations with a large pulse-duty factor including 1.0; and in a second state of the semiconductor switch, the pulsating means places the semiconductor switch in a pulsating nonconductive mode with a small pulse-duty factor.

2. A switch device according to claim 1, wherein said voltage stabilization circuit comprises
a rectifier diode and a capacitor connected in series with said diode between said two terminals; and
a stabilizing circuit having a first input terminal connected to a first terminal of said capacitor, and a second input terminal connected to a second terminal of said capacitor.

3. A switch device according to claim 2, wherein the semiconductor switch is operative to be continuously non-conductive in said first switch state and is mainly conductive in said second switch state.

4. A switch device according to claim 3, wherein the pulse-duty factor in said second switch state is less than 0.10.

5. A switch device according to claim 3, wherein said logic element is an AND circuit.

6. A switch device according to claim 3, wherein said logic element is an exclusive-OR circuit.

7. A switch device according to claim 3, wherein pulsating control of the semiconductor switch enables error diagnosis.

8. A switch device according to claim 1, wherein the semiconductor switch is operative to be continuously non-conductive in said first switch state and is mainly conductive in said second switch state.

9. A switch device according to claim 8, wherein the pulse-duty factor in said second switch state is less than 0.10.

10. A switch device according to claim 1, wherein said logic element is an AND circuit.

11. A switch device according to claim 1, wherein the pulse-duty factor in the first switch state is greater than 0.90 and the pulse-duty factor in the second switch state is less than 0.1.

12. A switch device according to claim 1, wherein said logic element is an exclusive-OR circuit.

13. A switch device according to claim 1, wherein said semiconductor switch is a field-effect transistor.

14. A switch device according to claim 1, wherein pulsating control of the semiconductor switch enables error diagnosis.

15. A switch device serving to switch current through a load as a function of a physical variable acting on the switch device, the switch device comprising:
a first terminal and a second terminal by which the switch device is to be connected to the load and to a source of power, the source of power providing power to the load and to the switch device;
a semiconductor switch interconnecting said first terminal and said second terminal;
a diode rectifier connected to said first terminal, and a capacitor connected in series between said diode rectifier and said second terminal;
a voltage stabilization circuit connected to a junction of said diode rectifier and said capacitor, a reference voltage source connected to said second terminal, and a sensor connected between said voltage stabilization circuit and said second terminal;
a threshold circuit having a first input terminal for receiving an output signal of said sensor, and a second input terminal for receiving a reference voltage outputted by said reference-voltage source; and
pulsating means for operating the semiconductor switch in a pulsating manner as a function of an output signal of the threshold circuit to provide a pulsating current to the load, the pulsating means including a pulse generator and a logic element, said logic element receiving signals outputted by said pulse generator and said threshold circuit, said logic element outputting a pulsating signal to a control terminal of said switch wherein a pulse duty factor of the pulsating signal and of the pulsating current is varied by the sensor output.

16. A switch device according to claim 15, wherein said logic element is an AND gate or an EXCLUSIVE-OR gate, and a presence of the pulsating current is an indication of proper operation of said switch device.

17. A switch device according to claim 15, wherein said pulse generator applies pulses to said logic element, and said threshold circuit signals said logic element via a low level signal or a high level signal as to whether the magnitude of the output signal of said sensor be below or above the magnitude of the reference voltage of said reference-voltage source;
in the presence of the low level threshold-circuit signal, said logic element is operative to place said semiconductor switch in a state of nonconduction to allow a relatively small current to flow through the switch device for powering the switch device without activating the load; and
in the presence of the high level threshold-circuit signal, said logic element operates said semiconductor switch in a pulsing mode alternating between states of conduction and nonconduction to draw pulses of a relatively large current through the load for activating the load, while allowing the powering of the switch device during intervals between the current pulses.

* * * * *